(12) United States Patent
Arik et al.

(10) Patent No.: US 6,864,571 B2
(45) Date of Patent: Mar. 8, 2005

(54) ELECTRONIC DEVICES AND METHODS FOR MAKING SAME USING NANOTUBE REGIONS TO ASSIST IN THERMAL HEAT-SINKING

(75) Inventors: Mehmet Arik, Niskayuna, NY (US); Stanton E. Weaver, Jr., Northville, NY (US); James C. Carnahan, Niskayuna, NY (US); Charles A. Becker, Schenectady, NY (US); William D. Gerstler, Niskayuna, NY (US)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/614,497

(22) Filed: Jul. 7, 2003

(65) Prior Publication Data

US 2005/0006754 A1 Jan. 13, 2005

(51) Int. Cl.⁷ .............................................. H01L 23/34

(52) U.S. Cl. ...................................... 257/712; 257/720

(58) Field of Search ................................ 257/707, 712, 257/713, 720

(56) References Cited

U.S. PATENT DOCUMENTS

| | | | |
|---|---|---|---|
| 6,282,907 B1 | 9/2001 | Ghoshal | |
| 6,297,063 B1 | 10/2001 | Brown et al. | |
| 6,340,822 B1 | 1/2002 | Brown et al. | |
| 6,383,923 B1 | 5/2002 | Brown et al. | |
| 6,407,922 B1 * | 6/2002 | Eckblad et al. | 361/704 |
| 6,445,006 B1 | 9/2002 | Brandes et al. | |

OTHER PUBLICATIONS

Y.–P. Zhao et al., Fabrication of Si Nanocolumns and Si Square Spirals on Self–Assembled Monolayer Colloid Substrates, Internation Journal of Nanscience, vol. 1, No. 1, World Scientific Publishing Company, (2002) 87–97.

Kenneth D. Harris et al., Website, "Microchannel Surface Area Enhancement Using Porous Thin Films," at http://www.doc.carleton.ca/~tis/papers/Microchannel.pdf, (file created Oct. 25, 2000).

P.M. Ajayan, "Nanotubes from Carbon," Chem. Rev. 1999, vol. 99, pp. 1787–1799.

David G. Cahill et al., "Nanoscale Thermal Transport," Applied Physics Reviews, in press, at http:/users.mrl.uiuc.edu/cahill/docfull.pdf, Jan. 7, 2003, pp. 1–30.

* cited by examiner

*Primary Examiner*—Roy Potter
(74) *Attorney, Agent, or Firm*—Fay, Sharpe, Fagan, Minnich & McKee, LLP (57) ABSTRACT

A semiconductor device die (10, 116) is disposed on a heat-sinking support structure (30, 100). Nanotube regions (52, 120) contain nanotubes (54, 126) are arranged on a surface of or in the heatsinking support structure (30, 100). The nanotube regions (52, 120) are arranged to contribute to heat transfer from the semiconductor device die (10, 116) to the heat-sinking support structure (30, 100). In one embodiment, the semiconductor device die (10) includes die electrodes (20, 22), and the support structure (30) includes contact pads (40, 42) defined by at least some of the nanotube regions (52). The contact pads (40, 42) electrically and mechanically contact the die electrodes (20, 22). In another embodiment, the heat-sinking support structure (100) includes microchannels (120) arranged laterally in the support structure (100). At least some of the nanotube regions are disposed inside the microchannels (100).

19 Claims, 8 Drawing Sheets

ELECTRONIC DEVICES AND METHODS FOR MAKING SAME USING NANOTUBE REGIONS TO ASSIST IN THERMAL HEAT-SINKING

BACKGROUND

The present invention relates to the electronics arts. It especially relates to flip-chip bonded light emitting diodes for lighting applications, and will be described with particular reference thereto. However, the invention will also find application in conjunction with die-bonding and cooling of other electronic devices.

Light emitting diodes are increasingly being employed in outdoor displays and signals, indoor illumination, and other applications that call for high levels of light output. To achieve improved light output, these devices are being driven with increasingly higher currents, resulting in thermally limited performance.

To improve heat removal, flip-chip mounted light emitting diodes have been developed. In the flip-chip arrangement, the active light emitting layers are grown on a transparent substrate, front-side contacts are fabricated on the light emitting layers, and the die is bonded front-side down to a lead frame, heat sink, or sub-mount so that light is emitted through the transparent substrate. The flip-chip arrangement places the heat generating active layers near the heat-sinking substrate or sub-mount, and also minimizes contact shadowing.

However, flip-chip bonding has certain disadvantages. Soldering is usually employed in the die-bonding. This involves substantial heating near the active layers which can degrade the device. If the die is bonded to a sub-mount, then two soldering processes are involved (a die-to-sub-mount soldering process and a sub-mount soldering process). The first soldering process is preferably performed at higher temperature so that the first solder bonds remain stable during the second soldering process. Moreover, relatively thick solder bumps are often employed for reliability. These thick solder bumps can limit thermal transport out of the light emitting diode die.

The present invention contemplates an improved apparatus and method that overcomes the above-mentioned limitations and others.

BRIEF SUMMARY

According to one aspect, a semiconductor device is disclosed, including a semiconductor device die. A heat-sinking support structure is provided, on which the semiconductor device die is disposed. Nanotube regions containing nanotubes are arranged on a surface of or in the heatsinking support structure. The nanotube regions are arranged to contribute to heat transfer from the semiconductor device die to the heat-sinking support structure.

According to another aspect, a method of fabricating a semiconductor device is provided. A semiconductor device die is attached to a die support. Nanotube regions containing nanotubes are formed on or in the die support. The nanotube regions are configured to conduct heat away from the attached semiconductor device die.

Numerous advantages and benefits of the present invention will become apparent to those of ordinary skill in the art upon reading and understanding the following detailed description.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. The device views are not drawn to scale.

DETAILED DESCRIPTION OF THE PREFERRED EMBODIMENTS

Figure 1:
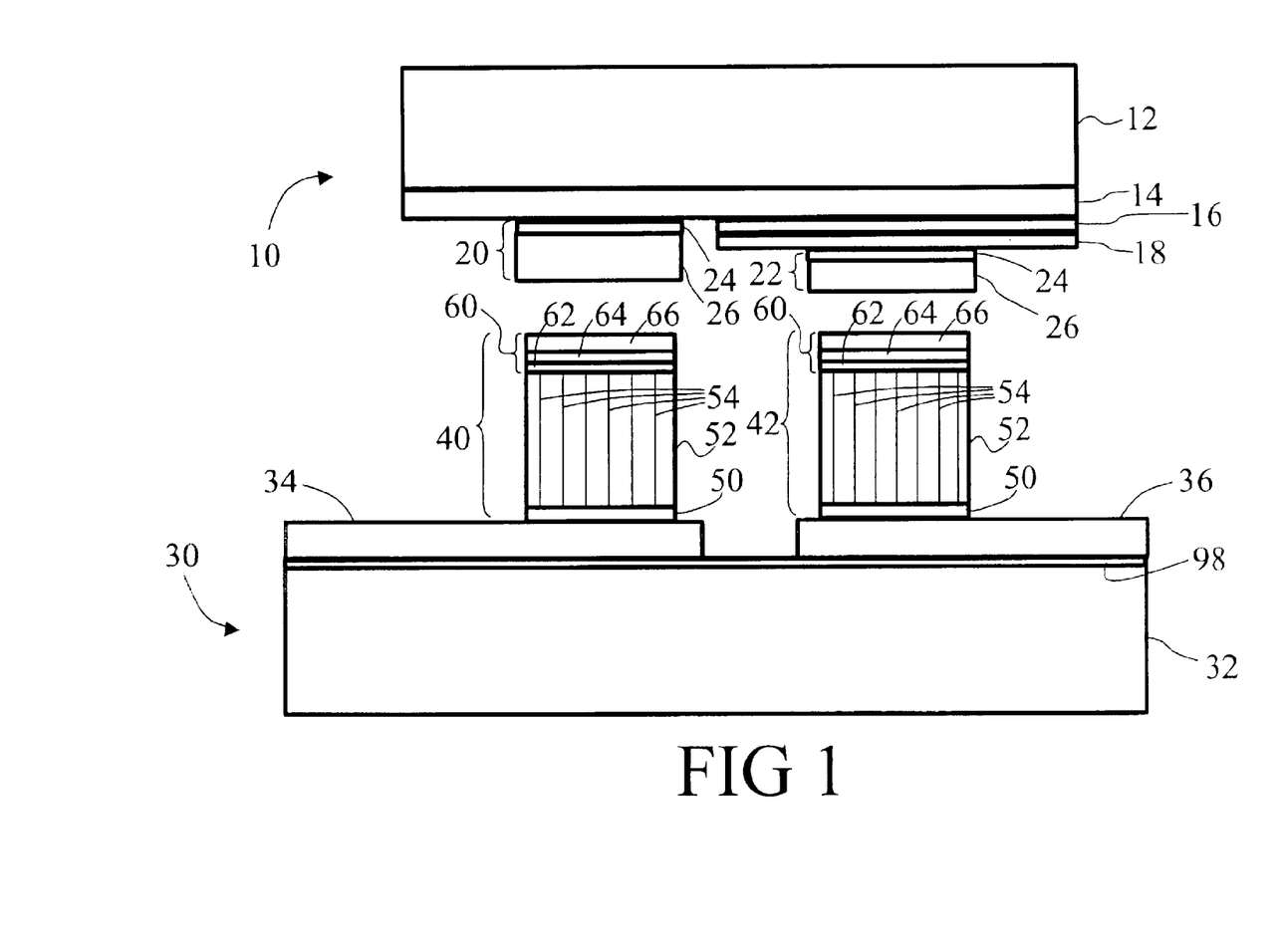
FIG. 1 shows a side view of a flip chip light emitting diode in position to be flip-chip die-bonded to a heat sinking support structure that includes die-bonding bumps including nanotube regions.

With reference to FIG. 1, a flip-chip light emitting diode die 10 is shown in position for die-bonding. The light emitting diode 10 includes a transparent substrate 12 and active layers 14, 16, 18 deposited on the substrate 12. In one suitable embodiment, the transparent substrate is sapphire or silicon carbide, and the active layers 14, 16, 18 are deposited by metal-organic chemical vapor deposition (also known by similar nomenclatures such as organometallic vapor phase epitaxy), molecular beam epitaxy, or another epitaxial film growth technique. The active layers 14, 16, 18 define a GaN-based p-on-n or n-on-p light emitting diode structure in which the layers 14, 18 are of opposite conductivity type and the interposed layer 16 defines an electron-hole pair recombination region at which electrons and holes from the outer layers 14, 18 recombine.

In some GaN-based light emitting diodes, the layer 16 is omitted and radiative recombination occurs principally around a junction of the layers 14, 18. Moreover, additional active layers can be included such as a window layer, a heavily doped contact layer, or the like. A growth buffer layer (for example of aluminum nitride) can be grown to improve the epitaxial growth. Moreover, other types of diodes besides GaN-based diodes can also be used, such as InAlGaP-based diodes, group III-arsenide-based diodes, and so forth.

The active layers 14, 16, 18 are processed, preferably lithographically, to define a mesa including the topmost layers 16, 18. Electrodes 20, 22 are formed off and on the mesa to electrically contact the layers 14, 18, respectively. In a suitable embodiment, the electrodes include a thin adhesion and diffusion barrier layer 24 and a thicker die-bonding layer 26, such as a nickel diffusion layer and a gold die-bonding layer. An adhesion layer (not shown) of titanium or another material can also be included. Although layer materials 24, 26 are shown for both electrodes 20, 22, different materials and/or more or fewer layers can be provided for the electrodes 20, 22 to produce electrode stability and electrical contact properties suited for each of the layers 14, 18, respectively.

The flip chip light emitting diode die 10 is die bonded to a heat sinking support assembly 30, which can be a submount, printed circuit board, or the like. The support assembly 30 includes a support 32 on which is disposed conductive layers 34, 36. The conductive layers 34, 36 optionally are part of printed circuitry, interconnect metallizations, wire bonding pads, or the like. The conductive layers 34, 36 are connected to external circuitry (not shown) for energizing the light emitting diode die 10 to emit light.

Disposed on each of the conductive layers 34, 36 is a bonding bump 40, 42, respectively. The bonding bumps 40, 42 are arranged to conform with an arrangement of the electrodes 20, 22 of the light emitting diode 10. The bonding bumps 40, 42 include a catalyst layer 50 of a metal, a metal alloy, or another material suitable for nucleating growth of nanotubes. A nanotube region 52 containing nanotubes 54 is grown on the catalyst layer 50. A few exemplary nanotubes 54 are shown diagrammatically in FIG. 1; however, the nanotube packing density is preferably much higher than that shown, and in one preferred embodiment the nanotube density is high enough so that neighboring nanotubes are in occasional contact.

Single-walled or multiple-walled carbon or boron compound nanotubes are suitably grown on the catalyst layer 50 by chemical vapor deposition or another suitable deposition technique. In chemical vapor deposition, the catalyst layer 50 is exposed to a hydrocarbon ambient at an elevated temperature. As is known in the art, nanotubes spontaneously form under such conditions for certain ambient temperatures and hydrocarbon ambient compositions and pressures. Nanotube growth can be controlled by selecting the temperature and ambient composition and properties, and by controlling the growth time. Preferably, the growth conditions are selected to produce a high density of generally parallel nanotubes that grow in a direction generally extending away from and normal to, the catalyst layer 50, as shown diagrammatically in FIG. 1.

The nanotube regions 52 define nanotube bonding bumps for die-bonding the flip-chip light emitting diode 10 to the support assembly 30. The nanotube bonding bumps are preferably coated with die-bonding metal layer stacks 60. In one suitable embodiment, each bonding stack 60 includes a titanium adhesion layer 62, nickel diffusion barrier layer 64, and a gold die-bonding layer 66. The light emitting diode die 10 is shown in position for die-bonding, but before bonding. In a preferred embodiment, the die bonding is performed by thermosonic gold-to-gold bonding in which the support assembly 30 is heated to about 150° C. with the bonding bump gold layers 66 contacting the corresponding electrode gold layers 26 of the light emitting diode 10. Upon application of ultrasonic energy, the gold layers 26, 66 bond, forming a die-attachment that is thereafter thermally stable up to about 600° C. Although thermosonic bonding is preferred, soldering or other die-bonding techniques are optionally employed in the die-bonding.

Once bonded, the nanotube regions 52 provide a highly thermally conductive path between the light emitting diode 10 and the substrate 30. While typical solders have thermal conductivities of about 25–60 W/mK and bump heights of greater than 25 microns for reliability, by contrast carbon nanotubes exhibit thermal conductivities typically over 1000 W/mK over a typical operating temperature range for a light emitting diode or other electronic device of about 0–150° C. Moreover, nanotubes are generally electrically conductive to provide an electrical path for energizing the light emitting diode 10.

Nanotubes have anisotropic thermal properties with maximum thermal conductivity along the axis of the nanotube, and so the preferred generally aligned nanotube orientation shown in FIG. 1 provides maximum thermal conduction from the light emitting diode 10 to the substrate 30. Advantageously, nanotubes 54 extending generally away from the catalyst layer 50 typically grow spontaneously under suitable deposition conditions. Some bending, intertwining, or other deviation of some or most nanotubes away from the generally aligned and straight nanotube orientation shown in FIG. 1 is contemplated; however, this does not obviate the substantial advantageous thermal and electrical properties of the nanotube regions 52. For example, predominantly helical nanotubes, also called nanosprings, are formed under certain deposition conditions. Moreover, the nanotubes 54 can be substantially filled. Filled nanotubes are also known in the art as nanorods. The nanotubes 54 of the bonding bump nanotube regions 52 are preferably columnar nanorods having relatively large cross-sectional areas (corresponding to diameters of about a hundred nanometers or more) to provide for substantial thermal conduction.

Those skilled in the art can readily modify the above-described exemplary flip-chip light emitting diode die 10 and/or substrate 30 to include additional or fewer active layers, different substrate and/or active layer materials, and the like. The light emitting diode die can also be configured with back-side contacts, rather than front-side contacts, using known fabrication techniques. Moreover, other types of semiconductor devices can be similarly bonded. For example, a transistor could be die bonded to nanotubes-based bonding bumps. It will further be appreciated that more than two electrodes can be die bonded. For example, a microprocessor chip including a large number of electrodes can be die-bonded using a plurality of corresponding nanotubes-based bonding bumps.

It is contemplated to optionally employ both nanotubes-based bumps and conventional copper or other metallic bonding bumps in a bonding pad configuration. In such an arrangement, the nanotubes-based bonding bumps are preferably arranged in high heat flux regions, while conventional copper bonding bumps can be employed in cooler device regions. The particular arrangement or distribution of bonding bumps is selected based on application and thermal managements considerations. Moreover, rather than employing local nanotubes-based bonding bumps, the entire sub-mount surface can be coated with nanotubes to provide for both heat extraction and lateral heat spreading. In such a uniform arrangement, electrical conductivity considerations should be considered. The uniform nanotubes layer may be patterned to provide electrical isolation between bonding pads or devices. Alternatively the bumps may be fabricated on the active device, i.e. LED, transistor, rather than on the submount or board. The same metal termination stacks would apply.

Figure 2:
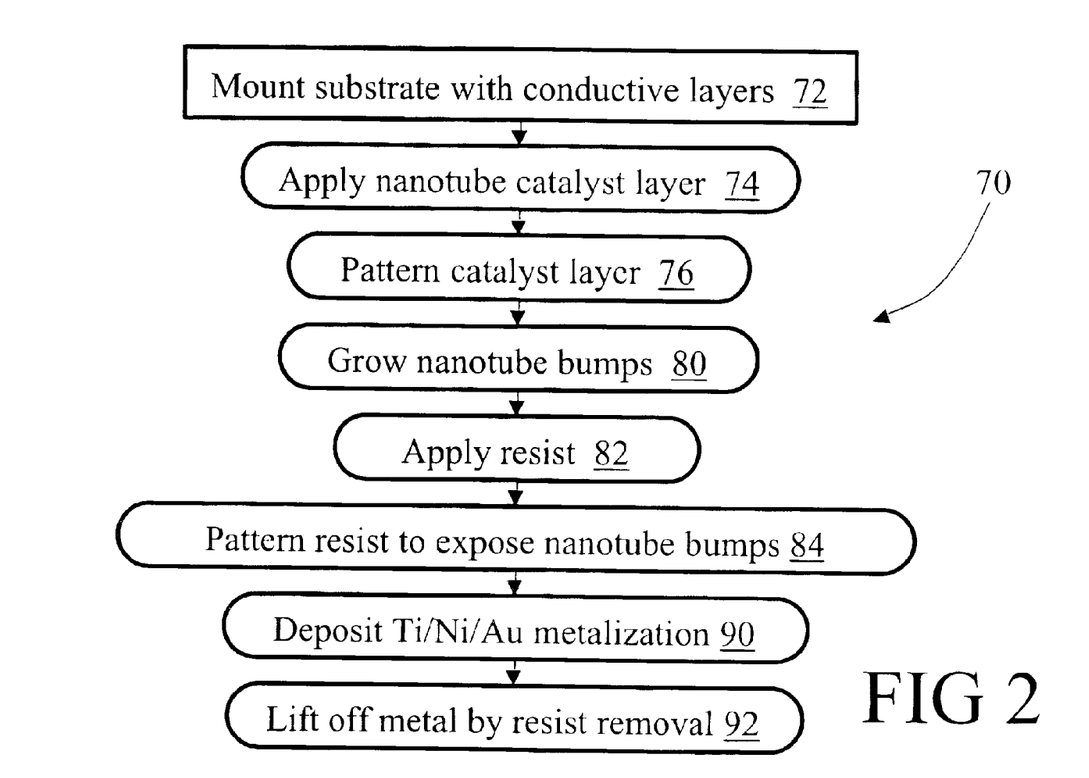
FIG. 2 shows a suitable method for fabricating the heat sinking support structure of FIG. 1.

With continuing reference to FIG. 1 and with further reference to FIG. 2, a suitable process 70 for fabricating the bonding bumps 40, 42 is described. The process 70 starts with providing a mounting or support assembly 72 that includes conductive layers such as the conductive layers 34, 36 shown in FIG. 1. The conductive layers can be printed circuitry, interconnect metallizations, wire bonding pads, or the like. The catalyst layer material is applied over the mount or support assembly in a deposition 74. The deposited layer is patterned 76, preferably lithographically, to remove the deposited layer except in the region of the bonding pads, leaving the lithographically defined catalyst layer 50 shown in FIG. 1.

After the patterning 76, the nanotube regions 52 are grown 80 by chemical vapor deposition using suitable ambient chemistry and pressure, process temperature, and like growth parameters. For boron alloy nanotubes, a boron-containing ambient is used in the chemical vapor deposition. The nanotube regions 52 are metallized in a lift-off metallization process 82, 84, 90, 92. In the liftoff process, resist is applied 82, followed by lithographic patterning 84 to expose the nanotube regions 52. A suitable sequence of metal layers is deposited 90, and the resist is removed or stripped 92. During the resist stripping 92, the overlying metal layers are lifted off except in the nanotube regions 52, where the metal remains as the die-bonding metal layer stacks 60 of the support assembly 30 shown in FIG. 1.

Rather than using the lift-off process 82, 84, 90, 92, in another suitable lithographic processing sequence (not shown) the metal is first deposited, followed by resist application and patterning to protect the deposited metal on the nanotube bumps. The exposed metal is then etched away leaving only metal on the nanotube bumps. Finally, the resist on the nanotube bumps is stripped.

Figure 3:
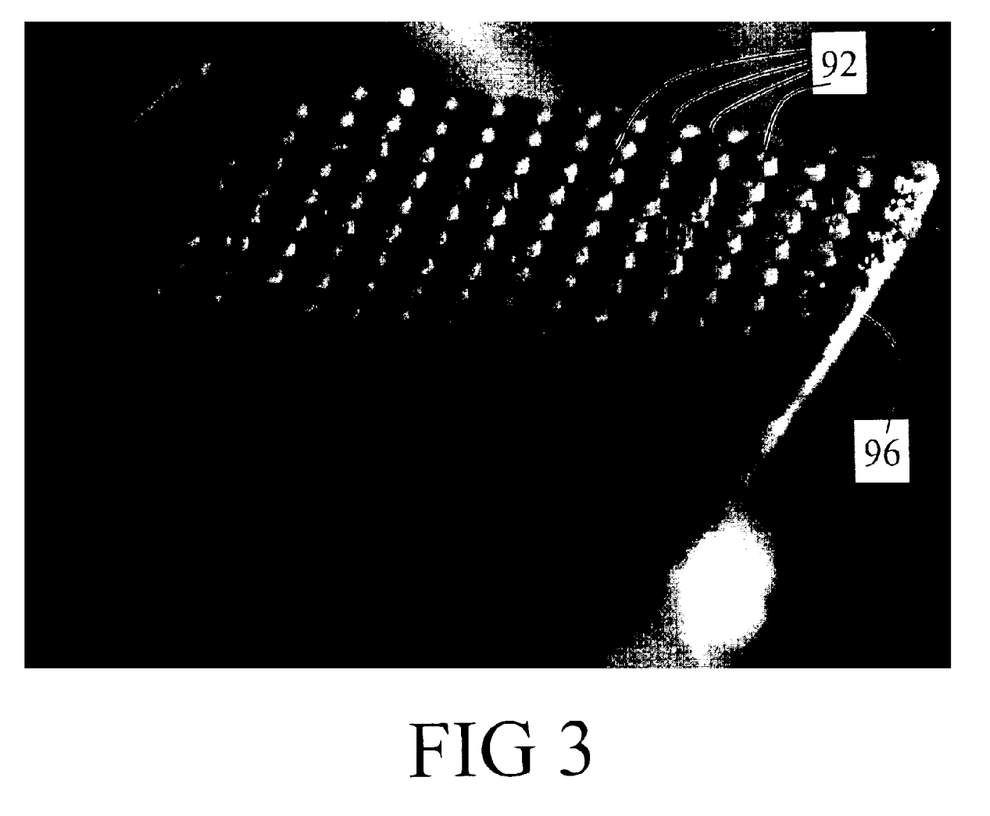
FIG. 3 shows nanotube bumps on the surface of a silicon wafer.

With reference to FIG. 3, an array of exemplary carbon nanotube bumps 94 grown on a silicon wafer 96 is shown. Each nanotube bump 94 includes a high density of generally aligned nanotubes. The nanotubes were grown by metal-organic chemical vapor deposition (MOCVD, also known as organometallic vapor phase epitaxy and similar nomenclatures). However, other types of chemical vapor deposition can also be employed, as well as other deposition techniques such as thermal evaporation, laser ablation, sputtering, and the like. Moreover, nanotubes of boron nitride, silicon, copper, or another suitable material can be employed instead of carbon nanotubes.

In a suitable nanotubes bumps growth process, the silicon substrate is cleaned in deionized water and then annealed at 700° C. in air for 5 minutes to develop a substantially uniform oxide layer, and to remove any adhering organic materials. The cleaned wafer is lithographically patterned using a metal mask and UV lamp operating at about 365 nm. The photoresist is developed and post-cured before deposition of the nanotubes bumps. Any wavelength is acceptable as long as it can expose the photoresist.

Nanotubes deposition is performed in a quartz reactor tube, which in one suitable embodiment includes a 2.5 cm diameter quartz tube with two temperature zones: a short zone at the inlet to the reactor, and a long zone where the reaction and deposition takes place. In a typical deposition, the first zone is set at about 175° C. and contains the gas inlet and a capillary steel tube with a crimped end that is used as a spray head. The second zone is in a clamshell furnace set approximately between 750° C. and 950° C. Higher temperatures tend to produce straighter nanotubes but may reduce coverage density. The isothermal zone of quartz reactor tube in one embodiment is about 30 cm long, with about a 20° C. temperature variance across the length.

After the substrates are loaded into the reactor tube, the system is purged with dry argon gas at about 1 standard liter per minute (SLPM), after which the gas composition is changed to about 10% hydrogen in argon at the same flow rate. The two oven zones are heated to their target temperatures. After an approximately 15 minute pause for equilibration, a hydrocarbon ambient including a carbon source and a catalyst are introduced.

The hydrocarbon ambient is suitably produced by pyrolyzing a mixture of a volatile metal species along with a carbon source. In one suitable deposition arrangement, the carbon source is an aromatic hydrocarbon such as xylene, and the catalyzing volatile metal species is ferrocene (dicyclopentadienyliron, CAS # 102-54-5). The catalyst concentration in the xylene is about 12 milligrams/ml. The solution of ferrocene in xylene is introduced via a syringe pump at a rate of about 45 microliters/min. After about 5 ml of solution is introduced, the system is held at temperature for 10 minutes to insure removal of all volatiles, and then cooled to below 200° C. before switching from the 10% hydrogen to pure argon. When the reactor reaches ambient temperature with the help of a cooling fan, the tube is opened and the coated substrates removed.

The exemplary conditions above typically produce a mixture of aligned multi-wall and single wall carbon nanotubes with an average length of about 120 to 150 microns. Some multiwall tubes have diameters of about 25 nm. The tubes typically contain residual iron from the catalyst.

It will be appreciated that the described growth process is exemplary only. Those skilled in the art can readily adapt the described growth process, or apply another growth process, to generate suitable nanotube regions for specific applications using available deposition facilities. For example, a physical vapor deposition method such as glancing angle deposition (GLAD) can be employed to produce nanotubes predominantly in the form of nanocolumns, nanorods or elongated nanosprings. Other approaches to aligned patterned nanotubes include nano-contact printing and other methods of applying nanotube growth catalysts on a substrate.

An exemplary suitable light emitting device embodiment has been described with reference to FIGS. 1–3, in which nanotube regions 52 are configured as components of die-bonding bumps 40, 42 to assist in thermal heat-sinking by providing a highly thermally conductive path from the light emitting diode 10 to the heat sinking support assembly 30. The heat sinking support assembly 30 may itself be a substantial thermal reservoir that dissipates heat, or it may be a heat sinking sub-mount that is thermally conductive and in thermal communication with a heat reservoir that dissipates heat.

In the case of a heat sinking sub-mount arrangement, heat dissipation is improved by ensuring that the sub-mount distributes heat laterally across the sub-mount to quickly remove the heat from the attached electronic device, and to assist in rapid dissipation of heat to the underlying heat reservoir. In the case of high-power light emitting diodes, a heat sinking sub-mount is typically fabricated from a silicon or silicon carbide wafer, which has relatively high thermal conductivity and which can be made substantially electrically insulating.

To improve lateral heat transfer of the heat-sinking sub-mount, a lateral heat-spreading film or structure 98 is optionally formed on the sub-mount. In one preferred embodiment, the structure 98 is diamond film grown by chemical vapor deposition, poly-crystalline deposition, or the like. In another contemplated embodiment, the structure 98 comprises nanotubes that substantially cover the sub-mount surface. Boron nitride nanotubes that are thermally conductive but substantially electrically insulating are beneficially employed for this purpose. The thermally conductive heat-spreading film 98 is especially beneficial for mounting more than one light emitting diode chip on a single sub-mount, for mounting a small light emitting diode chip on a substantially larger sub-mount, for other arrangements in which a lateral area of the sub-mount is large compared with a lateral area of the one or more mounted light emitting diodes.

Figure 4:
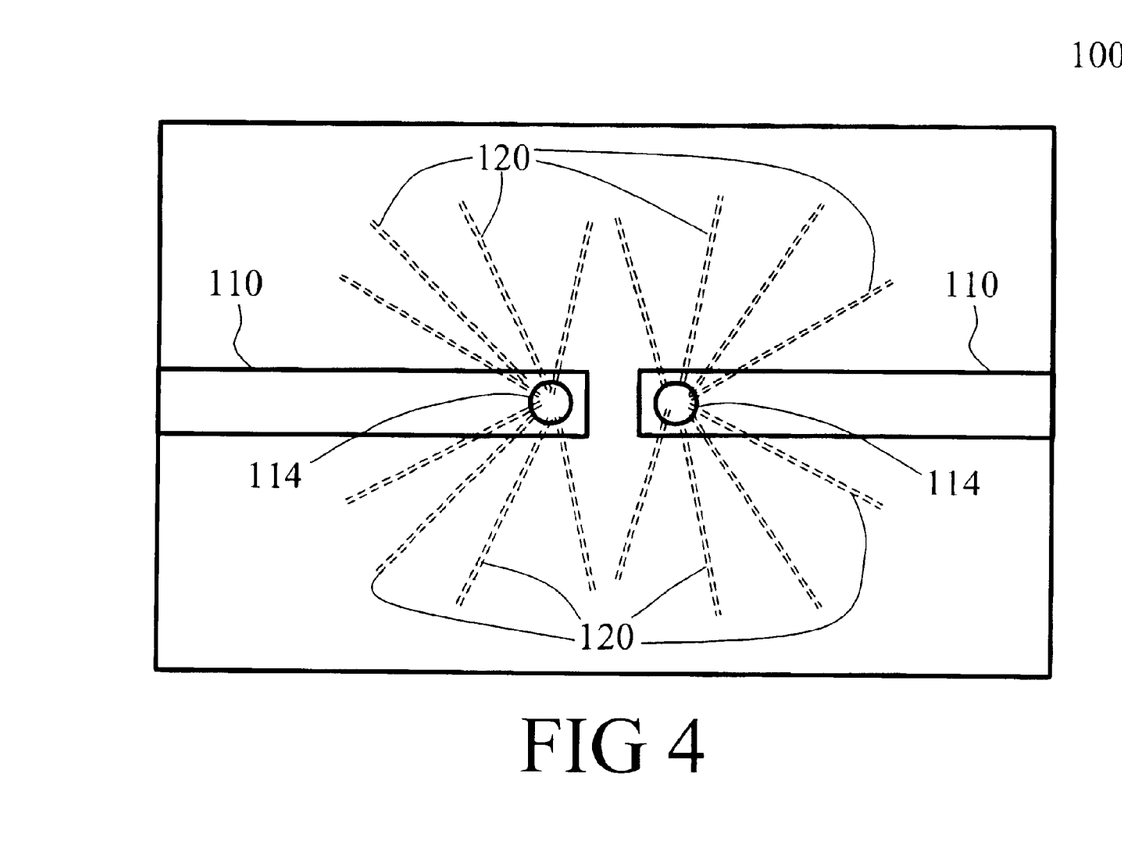
FIG. 4 shows a top view of a heat sinking sub-mount with microchannels of the sub-mount shown in phantom.
Figure 5:
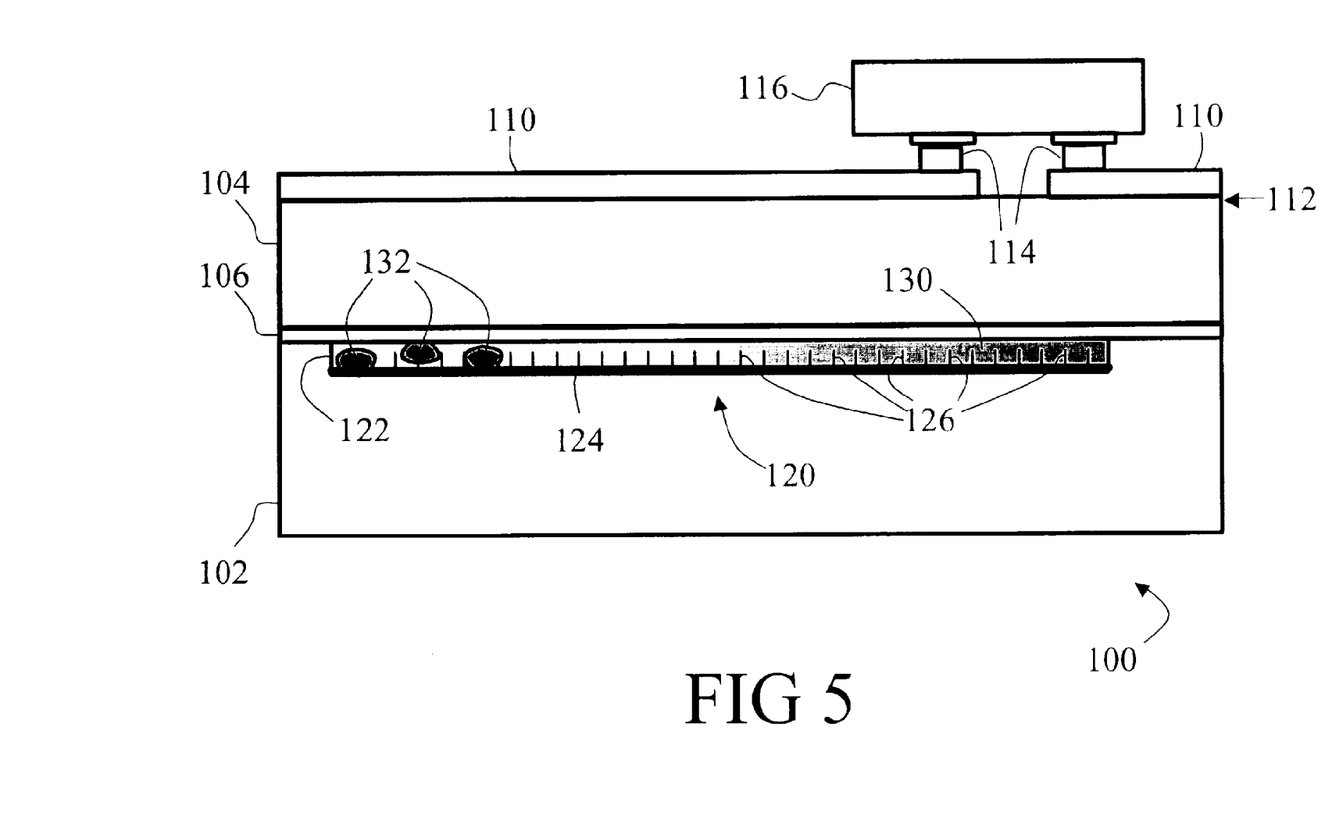
FIG. 5 shows a cross-sectional view of one of the microchannels of the heat sinking sub-mount of FIG. 4.

With reference to FIGS. 4 and 5, another embodiment of the invention is described, in which nanotube regions are configured to provide heat spreading in a heat-sinking sub-mount 100. This embodiment provides another mechanism for improved lateral heat transfer that uses nanotubes. Those skilled in the art will appreciate that good lateral heat transfer in electronics support elements is of general benefit to many areas of microelectronics and photonics, and its benefits are not limited to light emitting diodes. Efficient lateral heat transfer in the mount facilitates cooling of electronic or photonic chips in both flip-chip and conventional bonding arrangements. For certain such applications, boron nitride nanotubes are advantageously used to combine high thermal conductivity with low electrical conductivity. Thus, boron nitride-based nanotubes are particularly suitable for providing electrically insulative regions of high thermal conductivity.

The sub-mount 100 includes a bottom silicon sub-mount wafer 102 and a top silicon sub-mount wafer 104 that are anodically bonded via an oxide layer 106 disposed therebetween. Rather than anodic bonding, an adhesive or other type of bonding can be employed. Patterned conductive layers 110 are disposed on an exposed surface 112 of the top sub-mount wafer 104. Die bonding pads 114 are arranged on the conductive layers 110. The conductive layers 110 supply electrical power to a semiconductor device 116 such as a light emitting diode, microprocessor chip, or transistor, that is die-bonded to the bonding pads 114. The die-bonding pads 114 optionally include nanotube bumps such as the nanotube regions 52 of FIG. 1.

A plurality of thermally conductive microchannels 120 are shown in phantom in FIG. 4, and one of the microchannels 120 is shown in cross-section in FIG. 5. As shown in top view (see FIG. 4), the microchannels 120 extend laterally away from the die-bonding region in various lateral directions. (The die-bonding region is a region around the bonding pads 114 where heat from the attached semiconductor device 116 is injected into the heat sinking sub-mount 100). As shown in cross-sectional view (see FIG. 5), each thermally conductive microchannel 120 is defined by a groove 122 formed in the bottom sub-mount wafer 102 that is capped by the top sub-mount wafer 104 (or more specifically, capped by the oxide layer 106). The grooves 122 preferably have widths of about a few microns to a few tens of microns. Although a plurality of unconnected microchannels 120 are shown in FIG. 4, the microchannels can instead interconnect at the die-bonding region by intersection of the grooves 122.

A catalyst coating 124 is applied on surfaces of the microchannel 120. A thermal conductivity-enhancing nanotube region containing nanotubes 126 grown on the catalyst coating 124 is disposed inside the microchannel 120. A few exemplary nanotubes 126 are shown diagrammatically extending from the bottom of the groove 122 in FIG. 5; however, the nanotube density is preferably much higher than that shown in FIG. 5, and nanotubes preferably extend into the microchannel 120 from various sides of the groove 122 in addition to the bottom of the groove 122.

The microchannels 120 assist in lateral thermal conduction away from the die-bonding region. In the illustrated embodiment of FIG. 5, the microchannels 120 act as heat pipes, in which a fluid such as water conducts heat away from the die-bonding region by an evaporation/condensation cycle. Near the die-bonding region, the fluid is evaporated due to heat generated by the semiconductor device 116, to produce fluid vapor 130 (represented by shading in FIG. 5. The fluid vapor 130 diffuses away from the die-bonding region along the length of the microchannel 120. At an end of the microchannel 120 that is distal from the die-bonding region, the fluid vapor 130 condenses to form fluid droplets 132. Heat is conducted by the diffusing vapor and released by the condensation process. The condensed fluid accumulates and flows back toward the die-bonding region, where it re-evaporates to complete the evaporation/condensation cycle.

Rather than or in addition to heat pipe evaporation/condensation heat transfer, the microchannels can operate by thermal conduction through a substantially continuous liquid or gas disposed in the microchannels. For example, the microchannels can be air-filled or water-filled.

Thermal transfer through the microchannels 120 is assisted by the nanotubes 126 in several ways. The nanotubes 126 provide improved thermal coupling to surfaces of the grooves 122 to assist in heat transfer from the working fluid to bulk material of the heat sinking sub-mount 100. Nanotubes 126 also assist in fluid mixing. Moreover, the nanotubes 126 enhance capillary action in the microchannels which assists in migration of condensed fluid back to the die-bonding region. Still furthermore, nanotubes 126 create turbulence at the surfaces of the grooves 122. This turbulence inhibits formation of stagnant fluid layers at surfaces of the grooves 122. Nanostructures create flow disturbances which can be considered as local turbulences, although the bulk flow might be in the laminar flow regime. It will be appreciated that the spontaneously formed arrangement of the nanotubes, which extend generally inward from the groove surfaces, that is, aligned generally perpendicular to an axis of the groove, is particularly advantageous for creating turbulence and for transporting heat from interior regions of the microchannels 120 to the groove surfaces. However, substantial benefits will also be obtained from less ideal nanotube configurations that may be produced by certain growth conditions.

Figure 6:
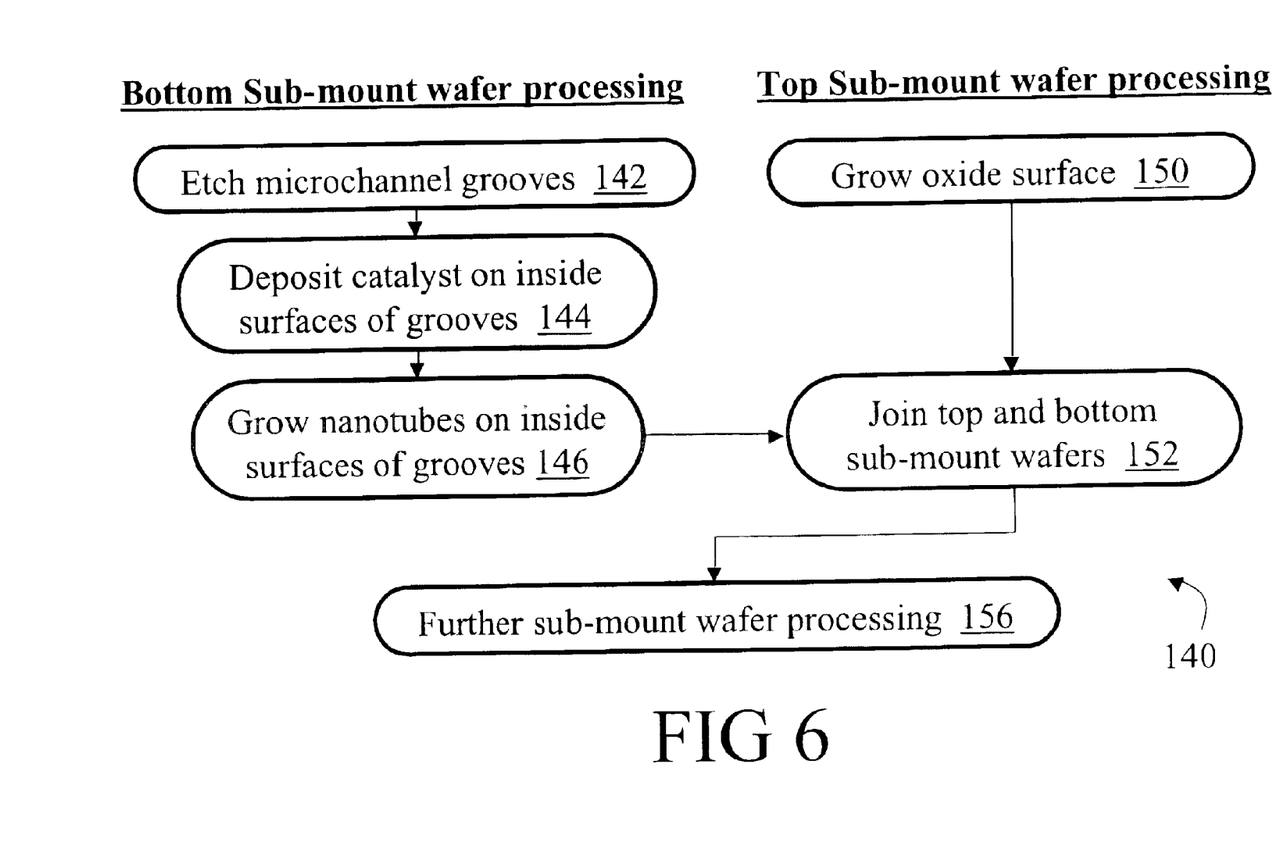
FIG. 6 shows a suitable method for fabricating the microchannels of the heat sinking sub-mount of FIGS. 4 and 5.

With continuing reference to FIGS. 4 and 5, and with further reference to FIG. 6, a suitable process 140 for fabricating the sub-mount 100 is described. Processing of the bottom sub-mount wafer starts with groove formation 142, which suitably includes lithographically patterned etching in which an applied and patterned resist defines lateral dimensions of the grooves 122. Anisotropic etching is optionally used to define a selected groove shape or faceted or otherwise configured groove surfaces.

In deposition 144, the catalyst coating is applied to the groove surfaces. The catalyst coating is a metal or other thin film that is effective for nucleating growth of nanotubes. In a suitable embodiment, the catalyst coating is applied before the patterned resist used in groove formation 142 is stripped off, so that the resist provides masking for the catalyst deposition 144 as well. The nanotubes 126 are grown by chemical vapor deposition 146. For a suitable ambient chemistry, pressure, temperature, and other growth parameters, a region of nanotubes with selected properties grows on catalyst-coated surfaces of the grooves 122. Other approaches to aligned patterned nanotubes can include glancing angle deposition (GLAD), nano-contact printing and other methods of applying nanotube growth catalysts on a substrate.

In separate processing, the oxide layer 106 is formed by oxidation 150 on the top sub-mount wafer, for example by thermal oxidation of the top sub-mount wafer in an oxygen-rich ambient. The oxidized surface of the top submount wafer is joined 152 to the surface of the bottom sub-mount wafer on which the grooves 122 are etched. In a preferred joining process, the two wafers are anodically bonded together by a combination of mechanical pressure and electrical biasing. However, other types of bonding can be employed. For certain bonding processes, such as bonding by the use of an adhesive, the oxidation process 150 is suitably omitted.

Optionally, the working fluid 130, 132 is introduced into the grooves 122 prior to or during the wafer bonding process 152. If the working fluid is intended to be air, the working air fluid is naturally trapped in the grooves 122 during the joining process 152. For water or another liquid working fluid, the fluid can be introduced by spinning the fluid onto the bottom sub-mount wafer 102', by application with a squeegee, or the like prior to the joining process 152. For a gaseous working fluid other than air, the wafer joining process 152 can be performed in a suitable ambient so that the desired working gas is trapped in the sealed grooves 122. The resulting joined wafer assembly preferably undergoes further processing 156 to deposit and pattern the conductive layers 100, form the bonding bumps 114, dice the joined wafer assembly to produce individual sub-mounts, and so forth.

In the apparatus 100 and fabrication process 140 of FIGS. 4–6, grooves are formed only in the bottom sub-mount wafer 102. However, the grooves can instead be formed in the top sub-mount wafer. Moreover, matched grooves can be formed in both the bottom and top sub-mount wafers and combined during wafer joining to define the microchannels. Furthermore, the microchannels can have lateral configurations other than the illustrated radiating linear configuration. For example, a rectangular microchannel grid or an array of concentric circular microchannels of increasing diameter can be used to spread and distribute heat laterally across the sub-mount. Microchannel regions can also extend other than laterally through the sub-mount. For example, microchannels can be disposed in vias oriented generally perpendicularly to the sub-mount, to assist in heat transfer through the sub-mount.

The microchannels 120 can have substantially any cross-sectional shape, such as a circular, rectangular, square, triangular, octagonal, pentagonal, or other cross-sectional shape. A hydraulic diameter $D_h$ of the channel wall is defined in terms of the cross-sectional area $A_{cross}$ and the wetted perimeter $P_{wet}$ according to $D_h=(4\ A_{cross})/P_{wet}$. The hydraulic diameter $D_h$ scales with the ratio of cross-sectional area $A_{cross}$ to wetted perimeter $P_{wet}$, and so cross-sectional shapes with large $A_{cross}/P_{wet}$ ratios are preferred for good thermal conduction.

Figure 7:
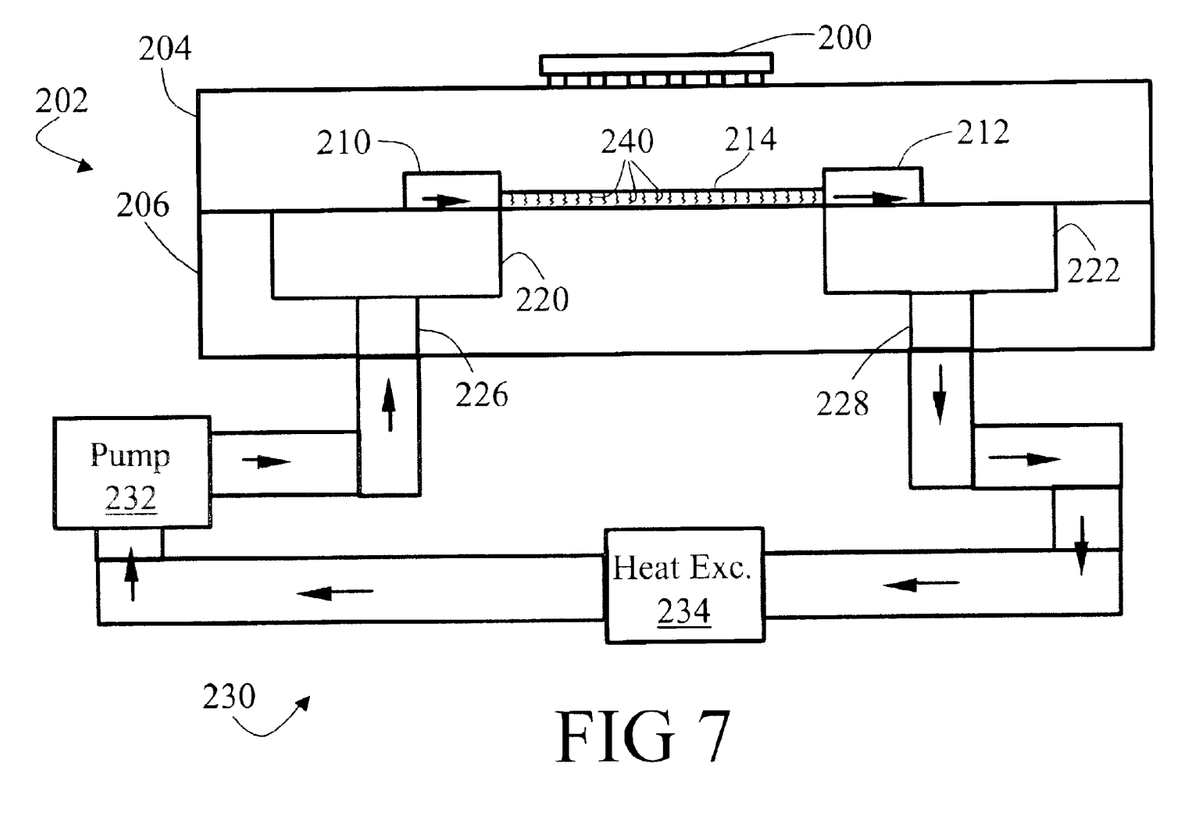
FIG. 7 shows a side sectional view of an actively cooled sub-mount for a microelectronic device.
Figure 8:
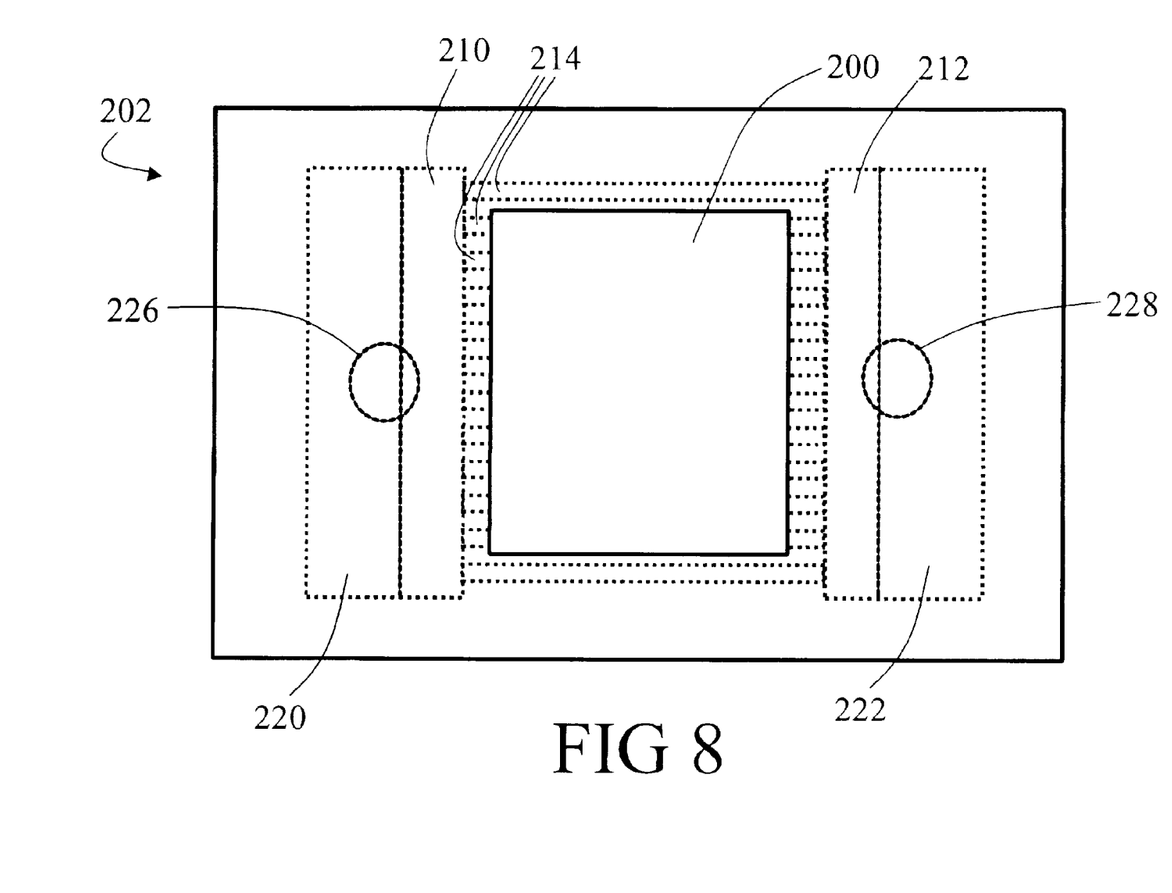
FIG. 8 shows a top view of the actively cooled sub-mount of FIG. 7, with the cooling system shown in phantom.

With reference to FIGS. 7 and 8, a sub-mount employing actively cooled microchannels is described. A heat-generating device 200 is bonded to a sub-mount 202 that is actively cooled. The heat-generating device 200 can be a high-power light emitting diode, a microprocessor chip, or the like. More generally, the device 200 can be any type of device that generates substantial heat and is advantageously actively cooled. The sub-mount 202 include a top portion 204 and a bottom portion 206 that are bonded together. In one preferred embodiment, the top portion 204 is a silicon wafer while the bottom portion is 206 is made of flexiglass. However, other materials can be used.

The bonding surface silicon top portion 204 is machined or lithographically processed to define entrance and exit fluid reservoirs 210, 212 and a plurality of microchannels 214 that connect the fluid reservoirs 210, 212. The bottom portion 206 includes larger entrance and exit fluid reservoirs 220, 222 that join the entrance and exit fluid reservoirs 210, 212, respectively, of the silicon top portion 204. A fluid inlet 226 is formed into the bottom portion 206 and is in fluid communication with the entrance fluid reservoir 220. A fluid outlet 228 is formed into the bottom portion 206 and is in fluid communication with the exit fluid reservoir 222. These features can be formed by machining, lithographic processing, or the like. The bottom and top portions 204, 206 of the sub-mount 202 are secured together by an adhesive, mechanical clamping, or other suitable attachment mechanism.

A recirculating cooling system 230 is connected between the fluid inlet 226 and the fluid outlet 228. The recirculating cooling system 230 includes a pump 232, which can be an axial, centrifugal, or other type of pump, and a heat exchanger 234. Arrows in FIG. 7 indicate flow direction of a working fluid that flows through the recirculating cooling system 230 and the sub-mount 202. The working fluid can be water, a dielectric fluid, oil, or the like. The heat exchanger 234 can be a thermoelectric cooling device, a passive radiator, or the like. Moreover, an open-loop cooling system can be employed instead of a closed-loop cooling system. The components 232, 234 of the cooling system 230 are shown as separate from the sub-mount 202 and connected to the fluid inlet 226 and fluid outlet 228 of the sub-mount 202 by fluid pathways; however, it is also contemplated to have some or all components of the cooling system attached to and supported by the sub-mount.

To promote heat transfer from the sub-mount 202 to the circulating fluid, the microchannels 214 include nanotubes 240 (shown diagrammatically in FIG. 7) extending inwardly in substantially aligned fashion from the walls of the microchannels 214. The nanotubes 240 are suitably deposited after the microchannels 214 are formed into the silicon top portion 204, but before the silicon top portion 204 is secured to the bottom portion 206. Since heat extraction from the sub-mount 202 to the working fluid is a function of the surface area of the nanotubes 240 and the fluid turbulence generated by the nanotubes 240, helical or otherwise-bent nanotubes, such as nanosprings 240 that are diagrammatically represented in FIG. 7, are preferred. However, straight hollow nanotubes, filled nanorods, or otherwise-shaped nanotubes can also be employed.

The density and average length of the nanotubes 240 is selected to maximize thermal transfer while permitting good fluid flow. A ratio of nanotube height to hydraulic diameter $D_h$ of close to unity (corresponding to the nanotubes substantially fully filling the cross-sectional area of the microchannels 214) provides good heat transfer but is likely to substantially impede fluid flow. Lower nanotube-to-hydraulic diameter height ratios enhance fluid flow at the expense of reduced heat transfer from the sub-mount 202 to the working fluid. Similarly, the density of nanotubes 240 on the walls of the microchannels 214 can be selected in a range of close to 0% (low nanotubes density) to close to 100% (high nanotubes density). Higher nanotubes densities promote heat transfer, while lower nanotubes densities enhance fluid flow.

For cooling high power light emitting diodes using 0.2 mm diameter microchannels, computer modeling suggests that about ten microchannels underneath the light emitting diode along with one microchannel on either side of the device (twelve channels total, as illustrated in FIG. 8) is adequate for cooling the light emitting diode. Additional microchannels beyond twelve can be used, however, and it is also contemplated to replace the microchannels 214 with a planar cooling plate, that is, a thin planar etched region of the top sub-mount, inside of which nanotubes are formed, that provides fluid flow and heat extraction in the area of the sub-mount lying beneath the heat-generating device.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light emitting device including:
   a light emitting die having a light-emitting principal side and a die bonding principal side opposite the light emitting principal side;
   a heat-sinking support structure on which the die bonding principal side of the light emitting die is disposed, the light-emitting principal side of the light emitting die facing away from the heat-sinking support structure to emit light; and
   nanotube regions containing nanotubes arranged between the heatsinking support structure and the die bonding principal side of the light emitting die, the nanotube regions arranged to contribute to heat transfer from the light emitting die to the heat-sinking support structure.

2. A semiconductor device comprising:
   a semiconductor device die including die electrodes arranged on the semiconductor device die;
   a heat sinking support structure on which the semiconductor device die is disposed;
   nanotube regions containing nanotubes arranged on a surface of or in the heatsinking support structure or on the semiconductor device die, the nanotube regions arranged to contribute to heat transfer from the semiconductor device die to the heat-sinking support structure; and
   contact pads defined by at least some of the nanotube regions, the contact pads electrically and mechanically contacting the die electrodes.

3. The semiconductor device as set forth in claim 2 wherein the contact pads further include:
   a conductive coating disposed over the nanotube region.

4. The semiconductor device as set forth in claim 3, wherein the conductive coating includes:
   an adhesion layer,
   a barrier layer; and
   a directly bondable layer disposed over the barrier layer.

5. The semiconductor device as set forth in claim 3, wherein the conductive coating includes:
   a gold layer thermosonically or thermocompression bonded with the die electrodes.

6. The semiconductor device as set forth in claim 2, wherein the nanotubes of the contact pads are generally parallel to one another and extend away from the heat-sinking support structure.

7. The semiconductor device as set forth in claim 2, wherein each contact pad includes:
   a generally planar catalyst layer disposed on the heat-sinking support structure; and
   generally aligned nanotubes that extend away from the catalyst layer.

8. The semiconductor device as set forth in claim 2, wherein the semiconductor device die includes:
   a light emitting diode device die having a flip-chip die electrode configuration.

9. The semiconductor device as set forth in claim 2, wherein the nanotubes of the nanotube regions that define contact pads are predominantly nanorods.

10. A semiconductor device comprising:
    a semiconductor device die;
    a heat-sinking support structure on which the semiconductor device die is disposed;
    nanotube regions containing nanotubes arranged on a surface of or in the heatsinking support structure or on the semiconductor device die, the nanotube regions arranged to contribute to heat transfer from the semiconductor device die to the heat-sinking support structure; and
    microchannels arranged laterally in the support structure, at least some of the nanotube regions being disposed inside the microchannels.

11. The semiconductor device as set forth in claim 10, further including:
    a thermal transport fluid disposed in the microchannels.

12. The semiconductor device as set forth in claim 11, further including:
    an active cooling system that circulates the thermal transport fluid through the microchannels.

13. The semiconductor device as set forth in claim 12, wherein the active cooling system is a recirculating active cooling system that includes a pump and a heat exchanger.

14. The semiconductor device as set forth in claim 10, wherein the nanotubes disposed inside the microchannels are oriented generally perpendicular to the microchannels.

15. The semiconductor device as set forth in claim 14, wherein the nanotubes are predominantly nanosprings.

16. The semiconductor device as set forth in claim 10, further including:
    a catalyst layer coating surfaces of the microchannels, the nanotubes disposed inside the microchannel extending generally away from the catalyst layer toward a center of the microchannel.

17. The semiconductor device as set forth in claim 10, wherein the heat-sinking support structure further includes:
    a first structure part with a first joining surface; and
    a second structure part with a second joining surface parallel to the first joining surface, the first and second joining surfaces securely contacting one another, the microchannels being defined by grooves in at least one of the first and second joining surfaces.

18. The semiconductor device as set forth in claim 17, wherein at least one of the first and second joining surfaces includes:
    an oxide layer that anodically bonds the first and second joining surfaces together.

19. The semiconductor device as set forth in claim 10, wherein the microchannels have a cross-sectional shape selected from a group consisting of circular, rectangular, square, triangular, octagonal, and pentagonal.

* * * * *